US005540376A

United States Patent [19]
Asla et al.

[11] Patent Number: 5,540,376
[45] Date of Patent: Jul. 30, 1996

[54] ANGLED PALLETS FOR WAVE SOLDERING

[75] Inventors: Jess Asla; Roy Lange; Ron Despain, all of Boise, Id.

[73] Assignee: Micron Electronics, Inc., Nampa, Id.

[21] Appl. No.: 324,087

[22] Filed: Oct. 14, 1994

[51] Int. Cl.⁶ .................................................. H05K 3/34
[52] U.S. Cl. ................................. 228/37; 228/43
[58] Field of Search ........................................ 228/37, 43

[56] References Cited

U.S. PATENT DOCUMENTS

| | | | |
|---|---|---|---|
| 5,024,370 | 6/1991 | Yakota | 228/180.1 |
| 5,067,433 | 11/1991 | Doll, Jr. et al. | 228/37 X |
| 5,067,648 | 11/1991 | Caseini | 228/43 |

OTHER PUBLICATIONS

*Research Disclosure* Mar. 1992 No. 335-57 Kenneth Mason Publications Ltd, England.

*Primary Examiner*—Kenneth J. Ramsey
*Attorney, Agent, or Firm*—Kevin D. Martin

[57] ABSTRACT

A pallet for holding a printed circuit board comprises first and second parallel rails and third and fourth parallel rails. The third and fourth rails each have first and second ends and form an angle of between about 30° and 60° with the first and second rails. The first and second ends of the third and fourth rails are connected to one of the first and second rails. The pallet further comprises an attachment for securing the printed circuit board to the third and fourth rails. The angled pallet has advantages over conventional pallets as shorts and shadowing are reduced.

18 Claims, 4 Drawing Sheets

5,540,376

ANGLED PALLETS FOR WAVE SOLDERING

FIELD OF THE INVENTION

The invention relates to printed circuit board assembly, and more specifically to a pallet for use during wave soldering of devices onto the printed circuit board.

BACKGROUND OF THE INVENTION

A common step used during the assembly of active and passive devices onto a printed circuit board (PCB) is a wave solder step. Wave soldering devices onto the PCB provides an automated method of interconnecting leads on the devices to solder pads on the PCB.

Referring to FIG. 1, during a typical wave solder operation a pallet 10 receives at least one PCB 12, and is placed on a conveyor (not shown) which moves the PCB along the wave solder machine (not shown). The wave solder generally comprises three steps: A fluxer applies flux to the bottom side of the PCB to prepare or clean the solder pad surfaces so the solder will adhere, then the PCB is preheated. Finally, the PCB is moved to the solder wave for electrical connection of the leads on the devices to the solder pads on the PCB.

Problems which can result from wave soldering include the formation of shorts and shadowing. Shorts occur when solder bridges two adjacent solder pads, and shadowing occurs when a trailing solder pad is not supplied adequate solder due to the effect of another pad on the flow of the solder wave. With shadowing, a weak solder connection is formed on the trailing pad which can cause the PCB to fail during testing, or the PCB may pass testing but fail during use. An apparatus which reduces shorts and shadowing would be desirable.

U.S. Pat. No. 5,024,370, which is incorporated herein by reference, describes a wave solder apparatus.

SUMMARY OF THE INVENTION

A pallet for use during wave soldering of devices to a printed circuit board comprises a rectangular frame, first and second parallel rails attached to the frame, and third and fourth rails for receiving the printed circuit board. The third and fourth rails are adjustably attached to the first and second rails, the third and fourth rails forming an angle of between about 30° and 60° with the first and second rails.

Objects and advantages will become apparent to those skilled in the art from the following detailed description read in conjunction with the appended claims and the drawings attached hereto.

It should be emphasized that the drawings herein are not to scale but are merely schematic representations and are not intended to portray the specific parameters or the structural details of the invention, which can be determined by one of skill in the art by examination of the information herein.

DETAILED DESCRIPTION OF THE DRAWINGS

Figure 1:
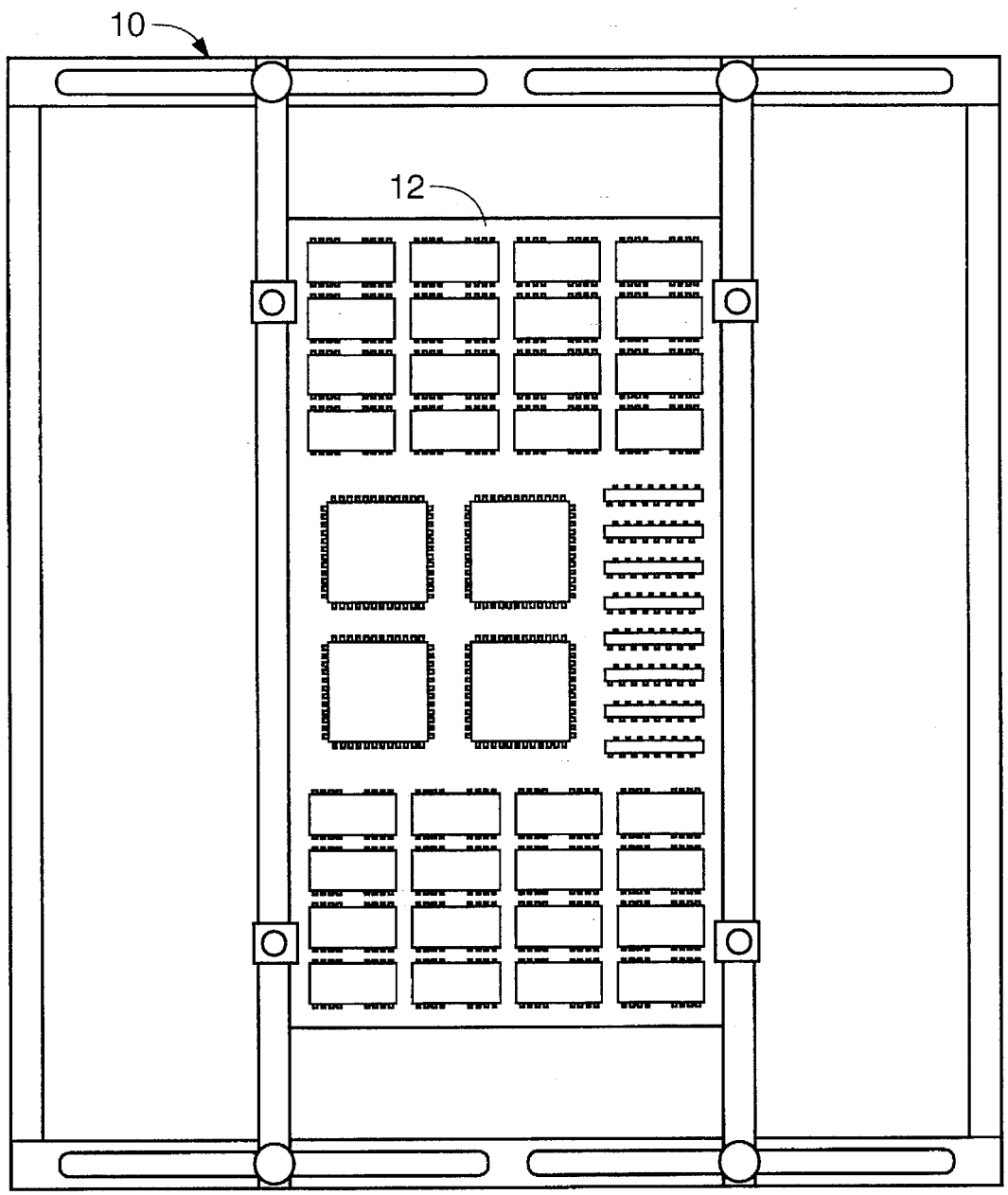
FIG. 1 is a top view of a conventional wave solder pallet with a printed circuit board mounted thereto.
Figure 2:
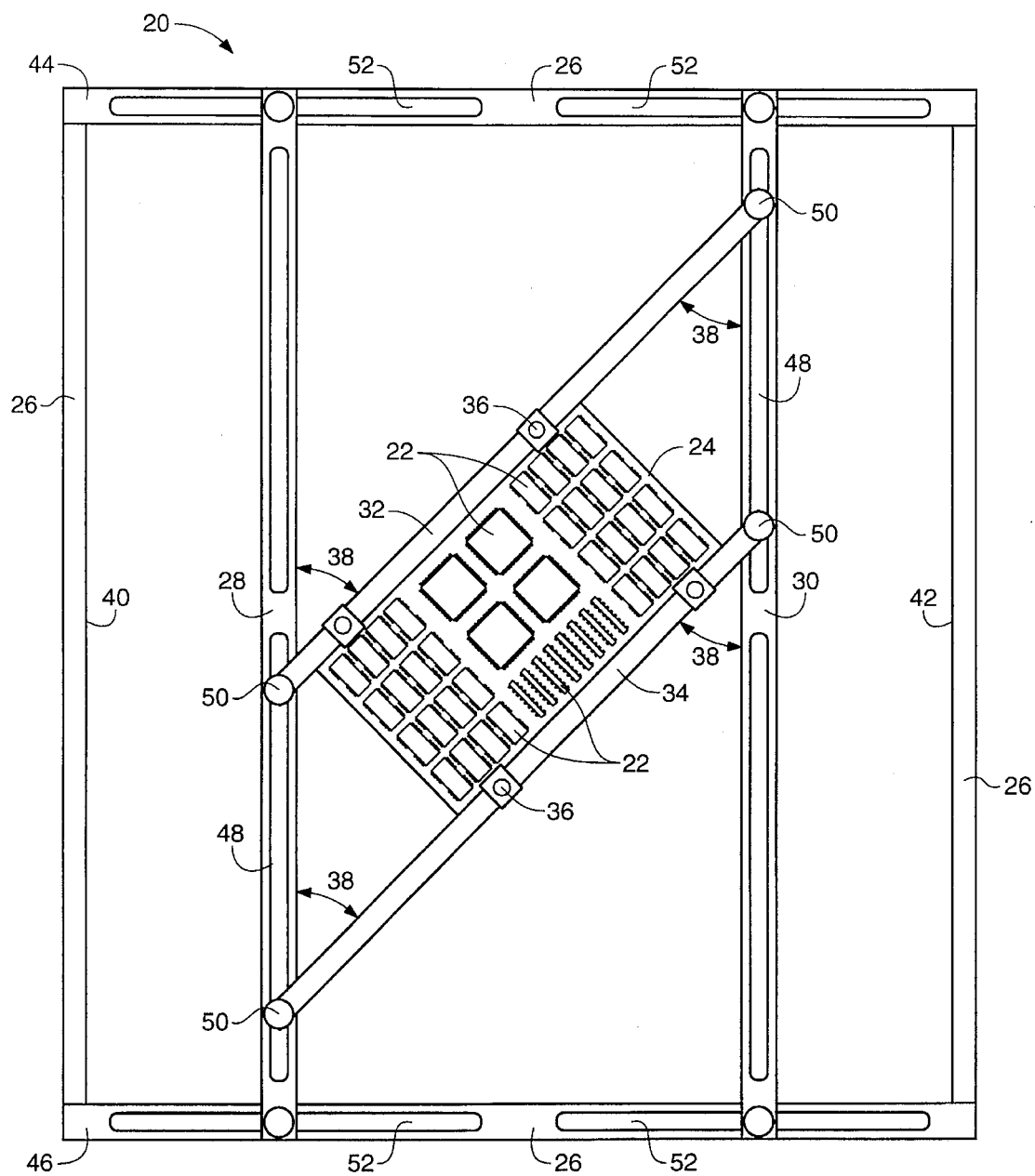
FIG. 2 is a top view of a first embodiment of the inventive pallet and a printed circuit board.

As shown in FIG. 2, a pallet 20 for use during wave soldering of devices 22 to a printed circuit board (PCB) 24 comprises a rectangular frame 26, first 28 and second 30 parallel rails attached to the frame 26, and third 32 and fourth 34 rails for receiving the PCB 24. The third 32 and fourth 34 rails can be adjustably attached to the first 28 and second 30 rails such that PCB's of varying size, or more than one PCB, can be received by the pallet. An attachment 36 secures the PCB to the third and fourth rails, such as by bolting the PCB to the rails, or by other workable means. It was found that when the third and fourth rails formed an angle 38 of about 45° with the first and second rails, shorts and shadowing were substantially reduced. Angles of between about 30° and 60° may also produce sufficient results.

The frame can comprise fifth 40, sixth 42, seventh 44, and eighth 46 rails or, as an equivalent, could be manufactured as a single piece. Slots 48 formed in the first 28 and second 30 rails allow the third 32 and fourth 34 rails to be adjustably attached to the first and second rails through the slots, for example using pins, bolts, rivets, etc. 50, and similar slots 52 in the frame 26 can be used to adjustably attach the first and second rails to the frame such that PCB's of varying size can be received by the pallet by adjusting the position of the pins in the rails.

Figure 3:
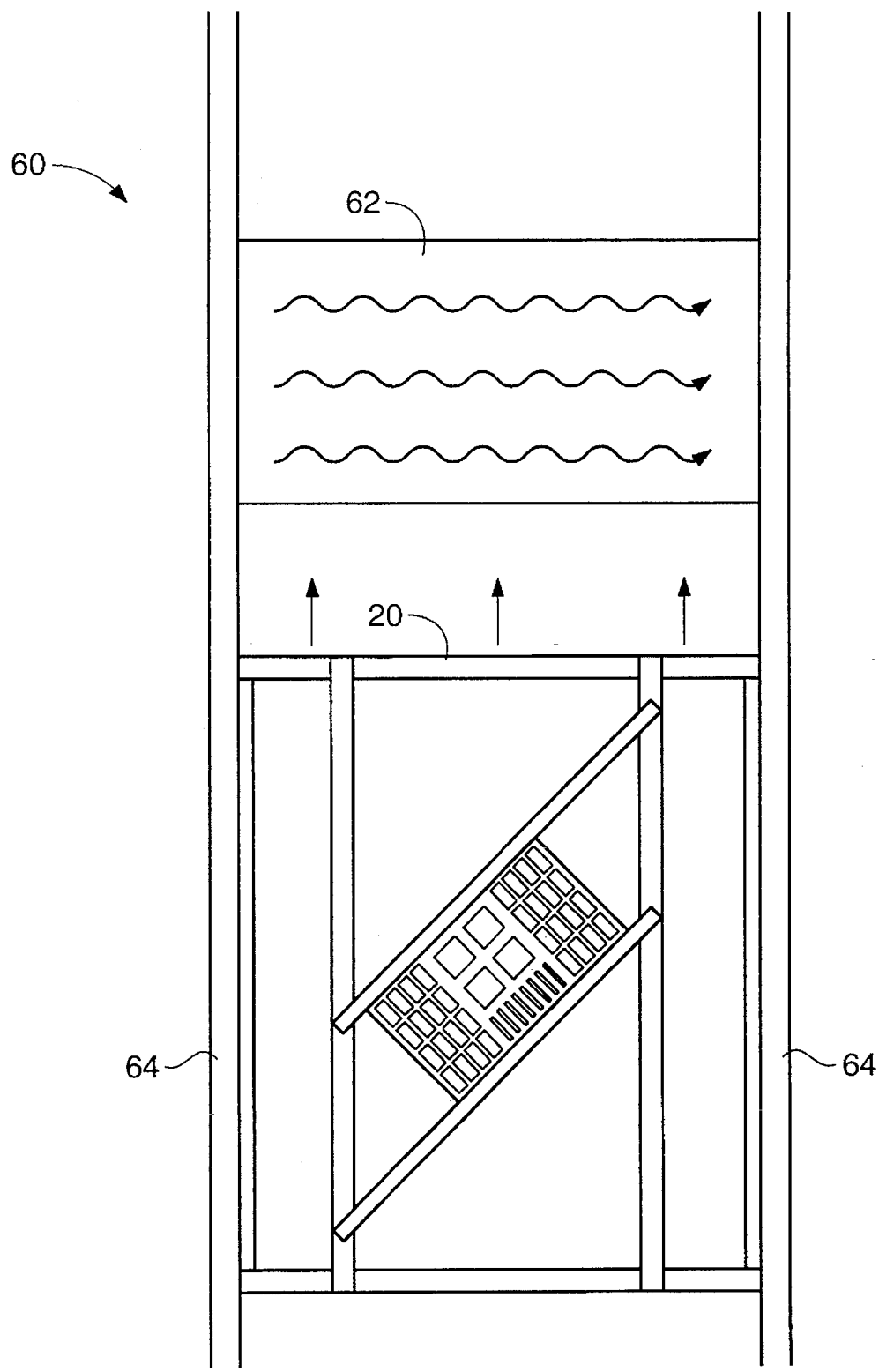
FIG. 3 shows a portion of a wave solder machine.

A portion of a wave solder machine is shown in FIG. 3. During use, the wave solder machine 60 comprises a reservoir of solder 62, the solder generally flowing in a first direction. The pallet 20 as described is received by a conveyor 64 for moving the pallet in a second direction which is perpendicular to the first direction. As the conveyor moves the PCB across the solder wave, the devices on the PCB are at an angle of between about 30° and 60° to the solder wave. The flow of the solder across the devices and the solder pads is substantially different with the inventive pallet, which results in the devices being at an angle of between about 30° and 60° to the solder wave, than a conventional pallet which results in the devices being at an angle of either 0° or 90° with the solder wave. This difference in the angle was found to result in fewer shorts and less shadowing.

Figure 4:
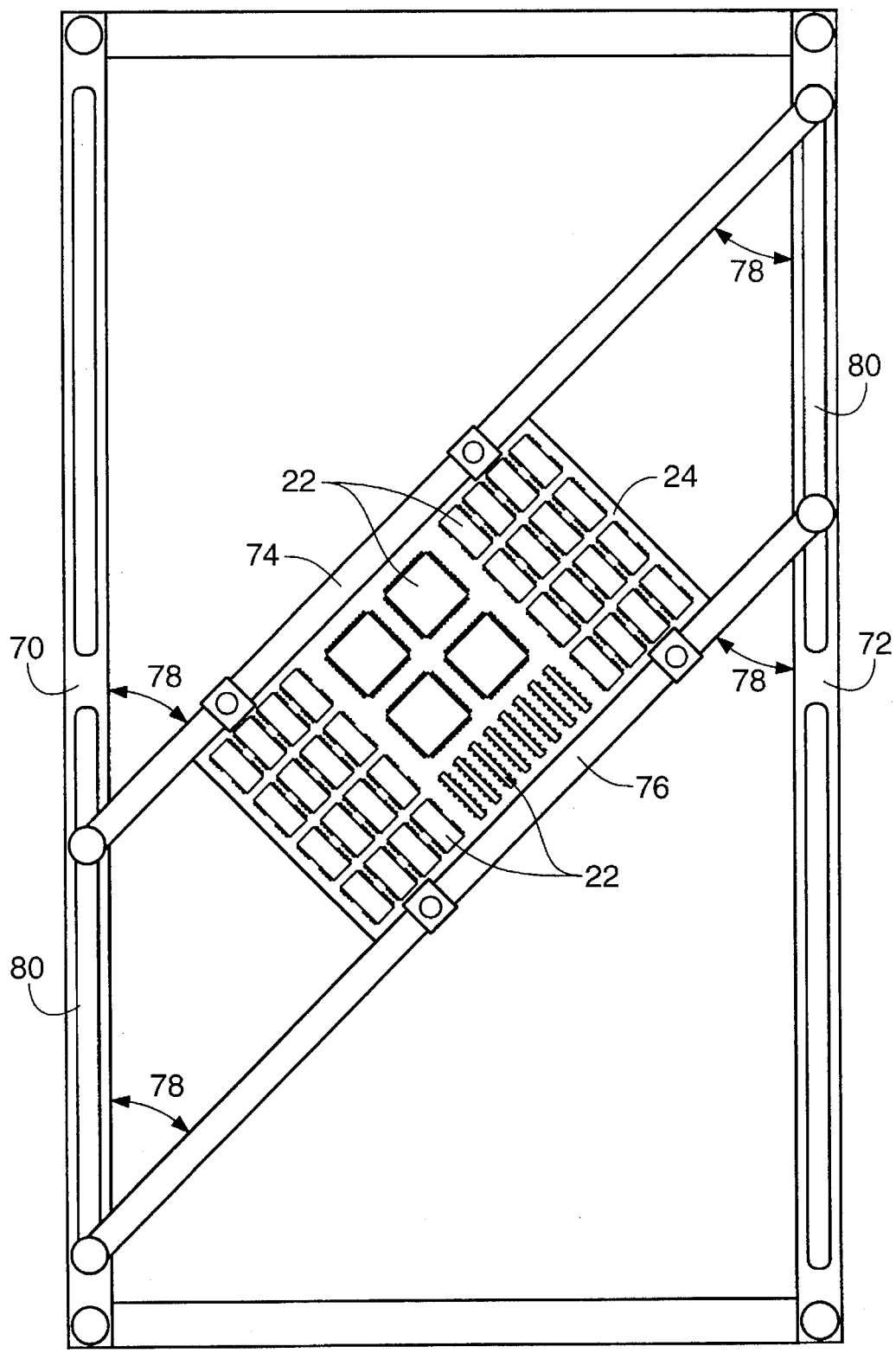
FIG. 4 shows a top view of a second embodiment of the inventive pallet.

FIG. 4 shows a second embodiment of an inventive pallet. In this embodiment the pallet comprises first 70 and second 72 rails, the rails being parallel to each other, and third 74 and fourth 76 parallel rails each having first and second ends. The third 74 and fourth 76 rails form an angle 78 of about 45° with the first and second rails, with the first and second ends of the third and fourth rails being connected to one of the first and second rails as shown. The first and second rails can comprise slots 80 for adjustably positioning the first and second ends of the third and fourth rails. An angle of between about 30° and 60° formed by the third and fourth rails and the first and second rails could produce sufficient results.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. It is therefore contemplated that the appended claims will cover any such modifications or embodiments as fall within the true scope of the invention.

What is claimed is:

1. A pallet for use during wave soldering of devices to a printed circuit board, comprising:

a) a rectangular frame;

b) first and second parallel rails attached to said frame;

c) third and fourth rails for receiving the printed circuit board, said third and fourth rails being adjustably attached to said first and second rails, said third and fourth rails forming an angle of between about 30° and 60° with said first and second rails.

2. The pallet of claim 1 wherein said first and second rails have slots therein, said third and fourth rails being adjustably attached to said first and second rails through said slots.

3. The pallet of claim 1 wherein said first and second rails are adjustably attached to said frame such that printed circuit boards of varying size can be received by said pallet.

4. The pallet of claim 1 wherein said third and fourth rails form an angle of about 45° with said first and second rails.

5. An apparatus for wave soldering devices to a printed circuit board, said apparatus comprising:

a) a reservoir of solder, said solder generally flowing in a first direction;

b) a pallet for holding a printed circuit board, said pallet comprising:
      i) first and second rails, said rails being parallel to each other;
      ii) third and fourth rails each having first and second ends, said third and fourth rails being parallel to each other and forming an angle of between 30° and 60° with said first and second rails, wherein said first and second ends of said third and fourth rails are connected to one of said first and second rails;
      iii) an attachment for securing the printed circuit board to said third and fourth rails;

c) a conveyor for receiving said pallet and for moving said pallet in a second direction perpendicular to said first direction.

6. The apparatus of claim 5 wherein said pallet further comprises:

a) fifth and sixth rails parallel to each other and to said first and second rails wherein each of said first and second rails is interposed between one of said third and fourth rails and one of said fifth and sixth rails.

7. The apparatus of claim 5 wherein said pallet further comprises seventh and eighth rails parallel to each other and perpendicular to said first, second, fifth, and sixth rails, said first, second, fifth, and sixth rails each having first and second ends, wherein said ends of said third and fourth rails are adjustably positioned along said seventh and eighth rails and said ends of said fifth and sixth rails are fixedly attached to first and second ends of said seventh and eighth rails.

8. The apparatus of claim 5 wherein said first and second rails have slots therein for adjustably positioning said first and second ends of said third and fourth rails there along.

9. The apparatus of claim 5 wherein said third and fourth rails form an angle of about 45° with said first and second rails.

10. A pallet for holding a printed circuit board, comprising:

a) first and second rails, said rails being parallel to each other;

b) third and fourth rails each having first and second ends, said third and fourth rails being parallel to each other and forming an angle of between about 30° and 60° with said first and second rails, wherein said first and second ends of said third and fourth rails are connected to one of said first and second rails;

c) an attachment for securing the printed circuit board to said third and fourth rails.

11. The pallet of claim 10 further comprising:

a) fifth and sixth rails parallel to each other and to said first and second rails wherein each of said first and second rails is interposed between one of said third and fourth rails and one of said fifth and sixth rails.

12. The pallet of claim 11 further comprising seventh and eighth rails parallel to each other and perpendicular to said first, second, fifth, and sixth rails, said first, second, fifth, and sixth rails each having first and second ends, wherein said ends of said third and fourth rails are adjustably positioned along said seventh and eighth rails and said ends of said fifth and sixth rails are fixedly attached to first and second ends of said seventh and eighth rails.

13. The pallet of claim 10 wherein said first and second rails have slots therein for adjustably positioning said first and second ends of said third and fourth rails there along.

14. The pallet of claim 10 wherein said third and fourth rails form an angle of about 45° with said first and second rails.

15. The pallet of claim 1 wherein said third rail is parallel with said fourth rail.

16. A pallet for use during wave soldering, comprising:

a) a frame;

b) first and second parallel rails attached to said frame;

c) third and fourth rails for receiving a printed circuit board, said third and fourth rails being attached to said first and second rails, said third and fourth rails forming an angle of between about 30° and 60° with said first and second rails.

17. An apparatus for wave soldering devices to a printed circuit board, said apparatus comprising:

a) solder generally flowing in a first direction;

b) a pallet for holding a printed circuit board comprising:
      i) first and second rails;
      ii) third and fourth rails each having first and second ends wherein said first and second ends of said third and fourth rails are connected to one of said first and second rails;
      iii) an attachment for securing the printed circuit board to said third and fourth rails; and c) a conveyor for receiving said pallet and for moving said pallet in a second direction perpendicular to said first direction.

18. The apparatus of claim 17 further comprising said third and fourth rails being parallel to each other and forming an angle of between 30° and 60° with said first and second rails.

* * * * *